United States Patent [19]

Benrud

[11] Patent Number: 4,498,058
[45] Date of Patent: Feb. 5, 1985

[54] LOW INPUT CAPACITANCE AMPLIFIER

[75] Inventor: Vernal M. Benrud, Eagan, Minn.

[73] Assignee: Sperry Corporation, New York, N.Y.

[21] Appl. No.: 378,556

[22] Filed: May 17, 1982

[51] Int. Cl.[3] .......................... H03F 1/38; H03F 3/16
[52] U.S. Cl. .................................. 330/300; 330/277; 330/292
[58] Field of Search .................. 330/68, 76, 78, 88, 330/89, 92, 93, 112, 277, 291, 292, 300, 311; 324/123 C

[56] References Cited

U.S. PATENT DOCUMENTS 4,390,852  6/1983  Addis ................................. 330/300

FOREIGN PATENT DOCUMENTS 2439491   2/1976  Fed. Rep. of Germany ...... 330/291
2514482  10/1976  Fed. Rep. of Germany ...... 330/300

OTHER PUBLICATIONS

Holmer, "An Electrometer Amplifier for Electrophysiology with Low Input Capacitance", Med. & Biol. Engng., vol. 8, No. 5, Pergamon Press, 1970, pp. 509–511.

Towers, "High Input-Impedance Amplifier Circuits", Wireless World, Jul. 1968, pp. 197–201.

Primary Examiner—James B. Mullins
Attorney, Agent, or Firm—William C. Fuess; Kenneth T. Grace; Marshall M. Truex

[57] ABSTRACT

A first feedback loop to a regulator transistor within the drain circuit of the input field effect transistor (FET) serves to maintain the voltage across the drain-gate junction of the input FET at a constant value consistent with FET operation as a source follower, thereby mitigating junction to junction capacitances within the FET. A second feedback loop created guard circuits on the cases of the input FET and the drain circuit regulator transistor, thereby mitigating junction to external circuitry capacitances. A third feedback loop modifies essentially constant current flow in the source circuit of the input FET in order to compensate for capacitance within that circuit. When utilized in compact form for microprobing of low voltage nanosecond rise time signals, the amplifier demonstrates an effective input capacitance of less than 0.5 picofarads.

5 Claims, 3 Drawing Figures

PARTS LIST

```
Q1   TRANSISTOR 2N4416
Q2   TRANSISTOR 2N5841
Q3   TRANSISTOR 2N5841
Q4   TRANSISTOR 2N5841
Q5   TRANSISTOR 2N4260
Q6   TRANSISTOR 2N2369
Q7   TRANSISTOR 2N2369
Q8   TRANSISTOR 2N3250
R1   RESISTOR, 1/8W, 5%, 4.7M OHMS
R2   RESISTOR, 1/8W, 5%  1 M OHMS
R3   RESISTOR, 1/8W, 5%, SELECTED, APPROXIMATELY 47K OHMS
R4   RESISTOR, 1/8W, 5%, 390K OHMS
R5   RESISTOR, 1/8W, 5%, 4.7M OHMS
R6   RESISTOR, 1/8W, 5%, 100  OHMS
R7   RESISTOR, 1/8W, 5%, 1K   OHMS
R8   RESISTOR, 1/8W, 5%, 1K   OHMS
R9   RESISTOR, 1/8W, 5%, 2K   OHMS
R10  RESISTOR, 1/8W, 5%, 8.2K OHMS
R11  RESISTOR, 1/8W, 5%, 470  OHMS
R12  RESISTOR, 1/8W, 5%, 470  OHMS
R13  RESISTOR, 1/8W, 5%, 1K   OHMS
R14  RESISTOR, 1/8W, 5%, 220  OHMS
R15  RESISTOR, 1/8W, 5%, 680  OHMS
R16  RESISTOR, 1/8W, 5%, 680  OHMS
R17  RESISTOR, 1/8W, 5%, 200  OHMS
R18  RESISTOR, 1/4W, 5%, 200  OHMS
R19  RESISTOR, 1/4W, 5%, 200  OHMS
R20  RESISTOR, 1/4W, 2%, 51   OHMS
R21  POTENTIOMETER, SPECTROL MODEL 69, 1K OHMS
R22  RESISTOR, 1/4W, 2%, 50   OHMS
C4   CAPACITOR, CHIP, 0.1 UF
C6   CAPACITOR, CHIP, 0.1 UF
C7   CAPACITOR, CHIP, 0.1 UF
C8   CAPACITOR, CHIP, 0.1 UF
C10  CAPACITOR, CHIP, 0.1 UF
C11  CAPACITOR, CHIP, 0.1 UF
C12  CAPACITOR, CHIP, 0.1 UF
C13  CAPACITOR, CERAMIC, 12 PF
```

*Fig. 2a*

PARTS LIST

C1  CAPACITOR, FORMED BY APPROXIMATELY 4 TURNS OF NO. 36 MAGNET WIRE AROUND R3

C2  CAPACITOR, FORMED BY APPROXIMATELY 7 TURNS OF NO. 36 MAGNET WIRE AROUND R5

C3  CAPACITOR, FORMED BY APPROXIMATELY 4 TURNS OF NO. 36 MAGNET WIRE AROUND R5

C5  CAPACITOR, FORMED BY APPROXIMATELY 4 TURNS OF NO. 36 MAGNET WIRE AROUND R8

C9  CAPACITOR, FORMED BY APPROXIMATELY 4 TURNS OF NO. 36 MAGNET WIRE AROUND R9 OR R10

COAX   COAXIAL CABLE, RG174/U, 5 FEET

*Fig. 2b*

LOW INPUT CAPACITANCE AMPLIFIER

BACKGROUND OF THE INVENTION

Three prior art low input capacitance amplifiers are the P6051 and P6201 oscilloscope probes of Tektronix Corporation, Beaverton, Oreg. and the LH0002/LH0002C general purpose thick film hybrid current operational amplifier of National Semiconductor Corporation, Santa Clara, Calif. Although considerably different in electrical design, number of components, and physical size from the current invention, the concept of the Tektronix P6201 probe will be discussed as indicative of the sophisticated and complex prior art resulting in a rated input capacitance of approximately 1.5 picofarads when shunted by 1.0 megohm attenuator heads. This abbreviated description is but a condensation and paraphrase of the more complete and exacting description of this circuit as appears in the instrution manual for this device.

As an active (FET) probe providing unity gain from DC to 900 MHz bandwidth, the low capacitance of the P6201 probe permits coupling of such high frequency signals to an oscilloscope input with minimum loading of the circuit under test. The P6201 Probe system uses a DC reinsertion amplifier technique to obtain low drift and broad-band performance. The input signal is simultaneously coupled in parallel paths to an AC/High Frequency Amplifier and to a DC/Low Frequency Amplifier. Signal outputs from these two stages are recombined in an Output Amplifier which provides the output signal at the proper 50 ohm load impedance. The AC/High Frequency Amplifier stage which is most comparable to the circuit of the present invention is based on an input FET operated as a source follower, such as provides the high input-resistance and low-noise performance of the probe input. No feedback loops concerning this input FET are utilized. Subsequent to the input FET there are emitter follower stages which provide the current gain and impedance isolation between the input signal and the output signal, in this case the output signal to the further Output Amplifier stage. Net 1.5 picofarad input capacitance of the P6201 probe amplifier is effectively resultant from the junction to junction, junction to case, and parasitic capacitances surrounding all signal carrying components within the circuit of the source follower operated input FET.

SUMMARY OF THE INVENTION

The present invention generally relates to an electrical apparatus by which low voltage (of the order of ±10 volts) input signals of nanosecond rise time may be amplified with maximum frequency response and minimum distortion. The present invention specifically relates to the mitigation of capacitance surrounding an input three port amplifier means via positive feedback loops in order that the reactive component of the impedance (the capacitance) seen by such input signals may be minimized.

It is a first object of the present invention that a three port amplifier, such as a field effect transistor (FET), operative to pass current from a first port (DRAIN) to a third port (SOURCE) responsively to an input signal received at a second port (GATE), should have the uneliminatable effects of the second port to first port (GATE to DRAIN) and the second port to third port (GATE to SOURCE) junction capacitances minimized by mitigation. Mitigation means that an active strategy, involving positive feedback, will be employed toward realizing this first object.

It is a second object of the present invention that such three port amplifier should have the uneliminatable effect of capacitance between the second port (GATE) and the case of such three port amplifier, and between the second port (GATE) and the circuitry beyond the case of such three port amplifier such as connects to such second port (GATE) minimized by mitigation. Mitigation means that an active strategy, involving positive feedback, will be utilized toward realizing this second object.

It is a third object of the present invention that the circuit of the output, third, port (SOURCE) of such three port amplifier should have the capacitance of such third port output circuit (SOURCE circuit) minimized by mitigation. Mitigation means that an active strategy, involving positive feedback, will be utilized toward realizing this third object.

It is the collective effect of realizing all three objects that all the capacitances seen by an input signal received at the second port (GATE) of a three port amplifier (FET) should be mitigated, and that the capacitance seen by the third port (SOURCE) output signal of such three port amplifier (FET) should likewise be mitigated, in order that such input signal should be minimally loaded while being current amplified with maximum frequency response (such as produces minimum distortion of such input signal waveform). In the preferred embodiment of the invention of a low input capacitance amplifier, input signals will see an impedance of 5 megohms resistance and 0.5 picofarads capacitance.

BRIEF DESCRIPTION OF THE DRAWINGS

FIG. 2 consisting of FIG. 2a and FIG. 2b shows a table listing the components utilized within the preferred embodiment of the invention.

DESCRIPTION OF THE PREFERRED EMBODIMENT

Figure 1:
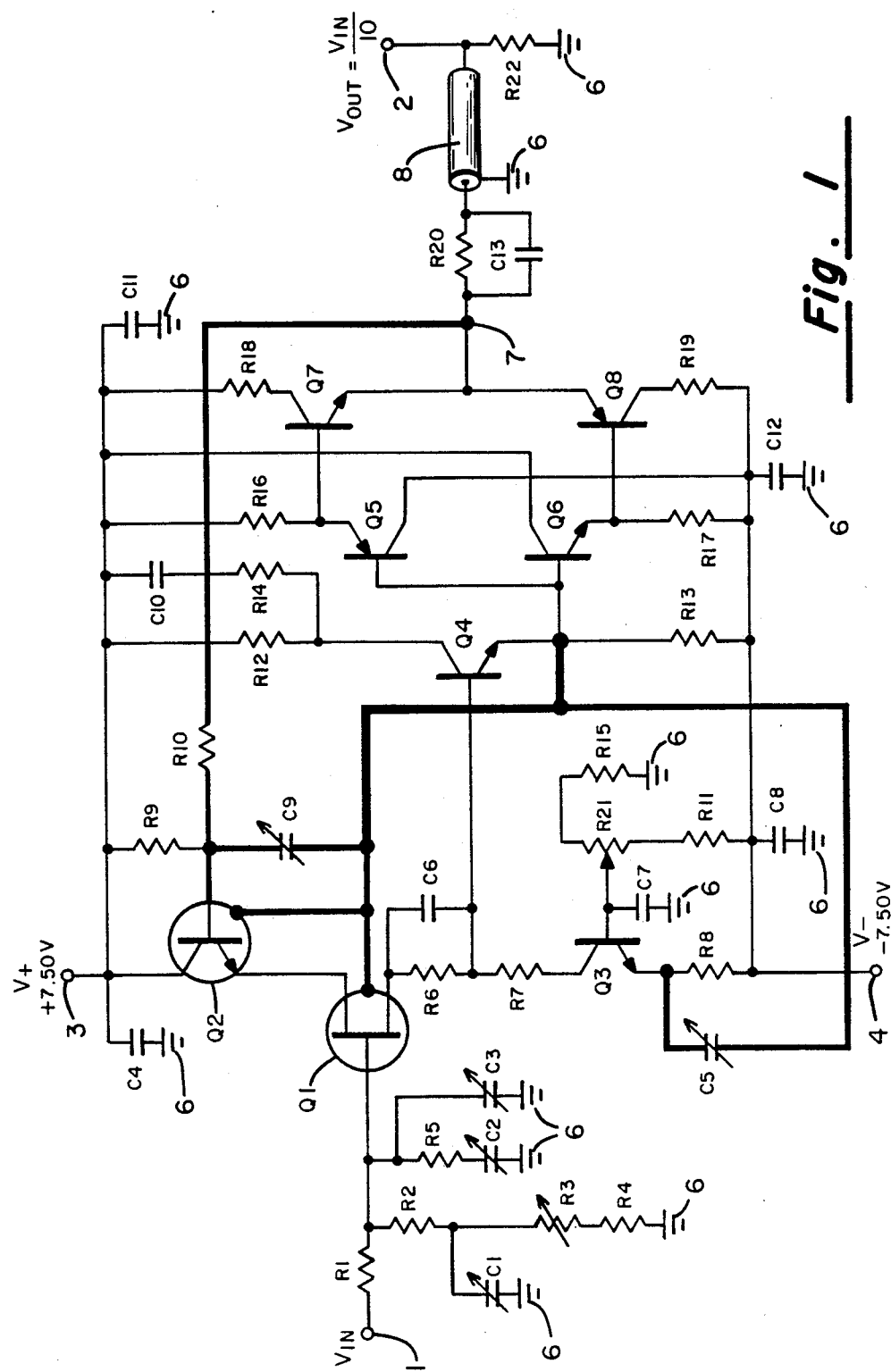
FIG. 1 shows a schematic circuit diagram of the preferred embodiment of the present invention.

The present invention of a low input capacitance amplifier incorporates three feedback systems for the minimization of input capacitance and consequent improvement of response time when the amplifier circuit is utilized as a microprobe amplifier in the observation of nanosecond waveforms. This triple feedback system implements three separable concepts in three separable feedback loops. The aggregate performance improvements of the present invention deliver an amplifier circuit roughly, but conservatively, estimated and empirically demonstrated to have an input capacitance of less than 0.5 picofarads. The circuit is compact and may be implemented as monolithic hybrid circuitry.

A first concept of the present circuit is to, as much as is possible, reduce or eliminate the effects of the gate to drain and the gate to source capacitance of an input field-effect transistor (FET) receiving the input signal. The effect of these capacitances is minimized by maintaining nearly constant voltages across the gate to drain and gate to source junctions of the input FET. In other words, if the (V) across the junctions are held nearly constant (dV/dt approaches 0), then under the physical law that charge (Q) equals capacitance (C) times voltage (V), then during dynamic FET operation that charge (ΔQ) which will flow to and from the junction capacitances ($C_{GATE\ TO\ DRAIN}$ and $C_{GATE\ TO\ SOURCE}$) will be minimal, causing a minimum impact on circuit response time. In other words $dQ/dt = C\ dV/dt$ will be minimized as $dV/dt$ approaches 0. Although the intrinsic capacitance (C) is not changed by such maintenance of nearly constant voltages across the gate to drain and gate to source junctions of the input FET, it is common to refer to such a circuit as being of low input capacitance, which really means that the incremental charge ($\Delta Q$) required to charge the capacitance (C) of the circuit is very small.

The manner by which such first concept should be implemented is as follows. The gate to source voltage of the input FET is nearly constant since it operates as a source follower. This much is old in the art. A dual-sourced feedback loop is additionally created to control a regulating transistor in the drain circuit of the input FET. This feedback controlled regulating transistor provides drain voltages for the input FET which track the gate voltage of the same input FET at a level $\Delta V$ above the gate voltage. The magnitude $\Delta V$ must be compatible with the operation of the input FET as a source follower. That is, the input FET gate to drain voltage is maintained nearly constant consistent with operation of this FET as a source follower. Increasing $\Delta V$ decreases the gate to drain capacitance. Maintaining $\Delta V$ at a maximum value serves to minimize the gate to drain capacitance seen by the input signal. The first separable feedback loop serving to accomplish this in the preferred embodiment of the invention, is obtained from two outputs within the amplifier—an intermediary and a final output—such as respectively accomplish very fast a.c. and a slower d.c. control of the driven regulating transistor. The source of the a.c. feedback signal is selected for minimum delay because any circuit time delay will deteriorate the frequency response of the amplifier circuit. The d.c. feedback signal determines the magnitude of $\Delta V$. Since under the physical law that charge (Q) equals capacitance (C) times voltage (V), if there is very little change in V (the drain voltage of the input FET is regulated by feedback control to be maintained at a nearly constant $\Delta V$ above the gate voltage) then very little charge will flow to the capacitance (C) existing between the gate and drain junctions. In other words, the effect of this uneliminatable capacitance is minimized, or mitigated. This feedback circuit is separable and severable from two other feedback circuits within the invention. This separable feedback circuit alone is considered to have the greatest beneficial impact upon the high performance of the preferred embodiment of the invention.

A second concept for reducing or eliminating the effects of circuit capacitances within the input FET is served by a second separable and severable feedback loop. There is some uneliminatable parasitic capacitance between the case of the input FET and the junctions contained therein and the surrounding circuitry. Therefore the case of the input FET, readily available as a fourth lead for the semiconductor device chosen in the preferred embodiment of the invention, is driven by a feedback signal derived from a subsequent stage. Importantly, the case of the regulator transistor in the drain circuit—such regulator transistor also subject to parasitic capacitance—is also identically connected. Thus the second, severable, feedback circuit to the case of the input FET and the regulator transistor serves to reduce the effects of capacitances between both junctions and such case and connected external circuitry by maintaining the case at a voltage that tracks the input signal. Recall that nearly constant voltage differences are already being maintained across both junctions of the input FET. Since the feedback loop extends to the case of the regulator transistor the signal connected junctions of this transistor also have capacitance effects minimized. This is of primary interest since the emitter controls the (drain of the) input FET. This technique used to minimize capacitive effects between active signal areas (e.g. junctions) and surrounding objects (e.g., cases) is called a guarding circuit. It is particularly effective in the circuit of the present invention because all voltage differences between elements of the input stage are maintained essentially constant. This separable second feedback circuit has a beneficial impact upon the high performance of the preferred embodiment of the invention.

There is a third, separable and severable, feedback circuit in the present invention of a low input capacity amplifier which supports the concept that rise and especially fall time response to an input signal can be improved if the normally constant source current for the input FET is feedback controlled. There is a transistor in the source circuit of the input FET in order to supply, when initially adjusted, a constant current to the input FET save for the small changes occurring during rapid variations in input voltage. Recall that the input FET is operated as a source follower. There is capacitance, parasitic and otherwise, associated with this source circuit of the input FET. This source circuit capacitance, not to be confused with the all-important minimization of capacitance effects on the input connected gate circuit previously discussed, is readily charged by the active device which is the input FET when a high going input signal is experienced. But when a low going input signal is experienced, this source circuit capacitance must be discharged. A problem exists if this is done but slowly through the current limited, constant current transistor of the source circuit. Namely, the response of the circuit of the present invention to low going signals is impaired. This constant current limitation is substantially overcome by a feedback path from the circuit output to the current controlling emitter of the constant current source transistor of the source circuit of the input FET. The output signal fed back through a very small capacitor beneficially serves to both decrease source current during a rising input signal and, most importantly, to increase source current (which discharges the source current capacitance) during a falling input signal. The feedback path through the very small capacitor effectively feeds back only very high frequency components of the signal, thereby helping to increase the frequency response of the amplifier circuit. Care must be taken in selection of the capacitor such as accomplishes the positive feedback so that the amplifier does not become unstable. The capacitor specified in the preferred embodiment of the invention is suitable for mitigation of the parasitic capacitance of a source circuit implemented with discrete components on a printed circuit board. If the circuit of the present invention is implemented in monolithic hybrid form, the coupling, through the small capacitor, of this third feedback loop needs to be adjusted to be consistent with stable, non-oscillatory operation of the amplifier. Thus a third, severable, feedback path serves to enhance the frequency response of the present circuit by compensating for device and wiring capacitance within the constant source current supply circuit to the input FET. This separable third feedback circuit also has a beneficial impact upon the high performance of the preferred embodiment of the invention.

The summary result of three feedback paths in the present invention of a low input capacitance amplifier is that the effects of several capacitances within or about the input FET are substantially eliminated or compensated for. Most importantly, the drain voltage is maintained through feedback paths to a regulating transistor at a constant separation from the circuit input gate voltage, which voltage separation is consistent with the operation of the input FET as a source follower. This source follower operation assures that the voltage across the gate-source junction is also essentially constant. Variations in voltage differences between elements of the input FET are almost eliminated. These minimum variations minimize junction and other capacitive effects, such as impair FET response to low current input signals at volt per nanosecond or faster rise and fall times.

A second capacitance mitigated in adverse effect upon circuit response is the capacitance between the active junctions and the case of the input FET. A feedback loop creating a guard circuit minimizes the effect of uunction-case capacitance by causing the case to track junction voltages. When all such junctions and the case track, it is obvious that only a minimum amount of charge needs be supplied by the input signal in overcoming the deleterious effect upon circuit response.

The third feedback path feeds back a very small portion of the output signal to the constant current transistor of the source circuit in order to account for fixed and parasitic capacitances in the source circuit of the input FET. This source circuit, for the source follower configuration of the input FET, is transmitting the input signal to later stages. Such capacitance as the source circuit exhibits is charged by the active device of the input FET upon a rising input signal but must be discharged through the constant current transistor of the source circuit upon a falling input signal. The feedback loop serves to modify current flow in this "constant" current transistor of the source circuit in such a manner as to augment the rapidity of charging (for a rising input signal) and especially discharging (for a falling input signal) the capacitance of the source circuit. The signal response of the present invention of a low input capacitance amplifier is thereby improved.

The three feedback loops of the present invention—such as respectively serve to minimize the effects of junction capacitances within the input FET, junction to case, gate lead to case, and surrounding circuitry capacitances, and capacitance in the source circuit of the input FET—could all be separately implemented. The efficacy of the second feedback loop, or guard circuit, is, however, diminished if the first feedback loop such as establishes voltage tracking for all elements of the input FET is not implemented. The third feedback loop for compensation in the constant current driver source circuit is completely separable and independent, with obvious applicability to prior art circuit structures. But the beneficient effect of the third feedback loop is also diminished without the presence of the first and the second feedback loops.

The electrical schematic circuit diagram of the preferred embodiment of the present invention of a low input capacitance amplifier is shown in FIG. 1. The detailed nature of the components referenced in FIG. 1 is itemized in the Table of FIG. 2, consisting of FIG. 2a and FIG. 2b. The circuit apparatus of FIG. 1 presents approximately 5.0 megohms resistance and 0.5 picofarads capacitance as the input impedance to a signal input, $V_{in}$, input at circuit input pin 1. It serves as a transimpedance amplifier to output this signal as voltage out $V_{out}$, being in magnitude one-tenth of $V_{in}$, at circuit pin 2. Since $V_{out}$ at pin 2 is at a characteristic impedance of 50 ohms the circuit is correctly called an amplifier circuit. The circuit is supplied with power of $+7.50$ volts as $V+$ at pin 3 and $-7.50$ volts as $V-$ at pin 4, in addition to ground pin 6. So constructed and connected, the circuit apparatus of FIG. 1 may be compactly assembled and utilized for microprobing as a metal oxide semiconductor very large scale integrated circuitry.

Commencing in FIG. 1, transistor Q1 is the source follower connected input field effect transistor (FET) for which the circuits of the present invention will attempt to reduce or eliminate major capacitive loading effects. Prior to this input FET, resistors R1 through R5 and capacitances C1 through C3 represent in aggregate the compensating circuit. The purpose of these components is to compensate for the inherent capacity which will be presented to the input signal from the leads and body of the input circuit pad through R1. This compensating circuit of resistances R1 through R5 and capacitances C1 through C3 is designed to make the analog voltage waveform appearing at the gate of FET Q1 exactly the same as that waveform presented to the microprobe tip which is pin 1.

The manner in which this is achieved is to design the input voltage divider consisting of resistances R1 through R5 and capacitances C1 through C3 so that both halves of the divider have the same RC time constant. After the inherent capacity of any actual physical embodiment is measured, the appropriate component values may be calculated by hand or by available computer programs for analyzing analog circuit response. The component values as listed in the Table of FIG. 2 are appropriate for an input voltage divider circuit of five-to-one which has a constant RC time constant at the input gate of FET Q1 equal to the time constant appearing at the microprobe tip of pin 1. Correct performance of this compensating circuit for any particular physical embodiment of the present low input capacitance amplifier may be validated by observing the time decay of a sample input waveform at the output pin 2 and adjusting circuit values so that no distortion occurs.

Momentarily referencing the other side of the circuit schematic of FIG. 1, it may be noted that the voltage out of characteristic 50 ohms impedance is obtained across one half of a two-to-one voltage divider circuit consisting essentially of R20 and R22. It is the five-to-one voltage divider action of the input circuit in conjunction with the two-to-one output voltage divider which establishes that $V_{out}$ shall be equal to one-tenth $V_{in}$. Thusly such active circuitry as occurs in between these voltage divider circuits will be of unitary voltage gain. There is, of course, a large amount of current amplification.

Continuing in FIG. 1, the purpose of the feedback circuits of the present invention will be to, as much as possible, reduce or eliminate the effects of unavoidable capacitances surrounding the signal flow through input FET Q1. A first feedback circuit is intended to reduce or eliminate the effects of the gate to drain and gate to source capacities of FET Q1. The effect of these capacities is minimized by maintaining nearly constant voltage differences across these respective junctions of Q1. The gate to source voltage is nearly constant since Q1 will operate as a source follower, that is, with a signal output at the source terminal. It is the purpose of transistor Q2 to provide drain voltages for FET Q1 which will track the gate voltage of FET Q1 at values large but compatible with operation of Q1 as a source follower. To that degree that the drain voltage of FET Q1 is maintained at some constant voltage $\Delta V$ above the gate voltage of FET Q1, the loading effect of the gate to drain capacity on the input signal is eliminated. The feedback circuit which will control transistor Q2 to this purpose within the drain circuit of FET Q1 is derived from two sources. A first d.c. feedback path is derived from output node 7 through resistor R10 to the gate terminal of transistor Q2. Such a path is illustrated by a first width heavy line in FIG. 1. To a similar purpose is an a.c. feedback path derived from the emitter of transistor Q4 through variable capacitor C9 to the same gate terminal of transistor Q2. This capacitance C9 may be variably adjusted to provide the high frequency component of feedback necessary for minimum distortion. This path is also illustrated by a first width heavy line. That nominal value for C9 as given in the Table of FIG. 2 assures reliable operation of this circuit for input voltages of ±10 volts. Resistor R9 and R10 determine the gate bias for transistor Q2.

Now that voltage across each junction within FET Q1 is nearly constant, it is advantageous to further guard against junction to case capacitances by the institution of a second feedback circuit. Such a second feedback circuit between the emitter of transistor Q4 and the cases of transistor Q2 and FET Q1 is shown by the second width heavy line within the circuit of FIG. 1. For the semiconductor components chosen for transistor Q2 and FET Q1, as shown in the Table of FIG. 2, the case is available as a fourth lead. As previously explained, this second, severable, feedback circuit to the case of the input FET Q1 serves to reduce the effects of capacitances between the circuit within FET Q1 and such case and connected external circuitry. It does so by maintaining the case at a voltage which tracks the voltages on internal circuitry. This technique is known as guarding the input. Since the feedback loop is also extended to the case of the regulator transistor Q2, the capacitive loading effects of the surrounding circuitry are further reduced. Input circuit guarding is of special applicability and beneficent effect to the circuit of the present invention as shown in FIG. 1 because it tends to eliminate any remaining capacitive loading of the input signal.

Continuing in FIG. 1, the operation of input FET Q1 in the source follower mode means that signal output will be provided through components R6 and C6 to the base of the subsequent stage transistor Q4. Transistor Q3 within the source circuit of FET Q1 provides a constant current source for FET Q1, save for such small changes as occur during variations in the input voltage at $V_{in}$ pin 1. Transistor Q3 is adjustably biased by the series network consisting of resistor R15, variable resistor R21, and resistor R11 so that such constant source current flowing within the resistances of R6, R7 across transistor Q3 and through resistance R8 of the source circuit of FET Q1 will correctly emplace such FET Q1 within its operating region. It is in this transistor Q3 provision of constant source current to FET Q1 that a third, severable feedback loop is used to account for remaining circuit capacities surrounding the source circuit of input FET Q1. These unavoidable and uneliminatable capacities are associated with components resistor R6, capacitor C6, the base of transistor Q4, and associated wiring. This third, severable feedback loop is from the emitter of transistor Q4 through variable capacitor C5 to the emitter of the constant current source transistor Q3. This feedback loop is represented by a third width heavy line in FIG. 1. This feedback loop via capacitor C5 improves the amplifier response by decreasing the source current to FET Q1 during a rising input signal and increasing the source current to FET Q1 during a falling input signal. In detailed explanation, when an input voltage signal is rising, the positive signal appearing at the emitter of transistor Q4 is passed through capacitor C5 and serves to raise the voltage at the emitter of source regulator circuit transistor Q3. This serves to reduce the current passed by transistor Q3. Consequently, the voltage at the source of input FET Q1 and the base of subsequent stage transistor Q4 will rise slightly faster because more current is available for charging the source circuit capacity. Since input FET Q1 is, however, acting as an active current sourcing device the end effect of this third feedback loop on a rising input signal is much less, however, than the corresponding effect upon a falling input signal. This is because during the condition of a falling input signal, when $V_{in}$ at pin 1 is decreasing, then the voltage at the source terminal of input FET Q1 will be decreasing and source circuit wiring capacity needs be discharged through essentially constant current sourcing transistor Q3. There is parasitic capacity about the source circuit of input FET Q1 and regulator transistor Q3. In the case of a falling input pulse, the negative going feedback signal provided through this third feedback loop via capacitor C5 serves to increase the current sinking capacity of regulator transistor Q3. Therefore, it can discharge this parasitic capacitance more rapidly and will therefore evidence a pronounced benevolent effect upon the frequency response to application of negative going input pulses.

Continuing in FIG. 1, transistor Q4, and associated bias circuitry as represented by resistors R12 through R14 and capacitor C10, is a current preamplifier prior to the output driver stage. Transistors Q5 through Q8 and associated bias resistors R16 through R19 constitute a driver circuit for 50 ohm coaxial cable. The configuration of the drive circuit is balanced so that there will be no net d.c. bias introduced into the signal path. This means that the base to emitter voltage drop occurring within NPN transistor Q6 will be compensated for by the corresponding base to emitter voltage rise within matched PNP transistor Q8. Similarly, the respective voltage rise and voltage drop occurring across the base to emitter junctions of PNP transistor Q5 and NPN transistor Q7 cancel each other. Any remaining net d.c. bias can be eliminated by a small adjustment of variable resistance R21, the reason being that it changes the voltage across R6. An output voltage divider consisting of resistors R20 and R22 and capacitor C13 is a simple impedance matching device for driving a 50 ohm load at the output port, such as connected to coaxial cable type RG174/U. As stated before, the five-to-one voltage divider effect of the input compensating circuit based on resistances R1 through R5 and capacitances C1 through C3, combined with the two-to-one voltage divider effect of the output stage voltage divider circuit, consisting of resistances R20 and R22 plus capacitor C13, is the basis of the net relationship that voltage out, $V_{out}$, at pin 2 equals voltage in, $V_{in}$, at pin 1 divided by 10. Since the input impedance is approximately 5 megohms, however, while the output impedance is 50 ohms, the circuit can correctly be described as a trans-impedance amplifier, or a current amplifier.

The net circuit of the present invention as shown in FIG. 1 is thusly seen to be powerfully protected against the distorting and loading effects of capacitances as surround all aspects of the active input device FET Q1. The performance of the present circuit may be assessed by passing a pulse generator pulse of very fast rise time through a source resistance into the present very low input capacitance amplifier circuit and then to a high performance oscilloscope. For example, a pulse of rise time 5 nanoseconds as generated from commercially available pulse generator Hewlett Packard type HP215A and passed through a resistance of 10K ohms into the Tektronix probe type P6201 will show a rise time of approximately 60 nanoseconds when observed on an oscilloscope Tektronix type TEK7844. When the present low input capacitance amplifier circuit is utilized as a probe amplifier, such as amenable due to the compact construction thereof, the corresponding observed rise will be approximately 15 to 18 nanoseconds. It is solely by the basis of this comparison between empirical results achieved on observed waveforms that the input capacitance of the present circuit is conservatively estimated to be 0.5 picofarads in relation to the published capacitance of Tektronix FET probe type P6201 equalling 1.8 picofarads. The resistive loading of the Tektronix's P6201 FET probe is also approximately five times greater than that of the present low input capacitance amplifier. The high performance and compact physical size of the present circuit allows microprobing of a metal oxide semiconductor chip such as is useful for determination of logical performance in design verification and failure analysis.

In consideration of the present invention showing three feedback paths for control of capacitive effects on the input to an amplifier circuit, what is claimed is:

1. In an amplifier circuit wherein an encased three port means for first amplifying passes current from a first port to a third port responsively to an input signal recieved at a second port thusly providing an amplified output of said input signal as a first amplilfied input signal upon said third port and wherein capacitance exists between said ports and between each said port and a surrounding case and between each said port to external circuitry beyond said case, and wherein said first amplified input signal is next passed to a plurality of subsequent amplifying means for further amplification, a circuit apparatus for controlling said first amplifying means which comprises;
   first regulating means responsive to a first signal for controlling the voltage at said first port of said first amplifying means;
   first positive feedback loop means for directly feeding back as direct current from one of said plurality of subsequent amplifying means an amplified output of said input signal as said first signal; and
   second positive feedback loop means for directly feeding back as direct current from one of said plurality of subsequent amplifying means to said case surrounding said first amplifying means an amplified signal of magnitude and phase such as charges said case to substantially the same voltage as said input signal;
   wherein the magnitude and positive direction of said feedback first signal as controls said regulating means keeps said first port of said first amplifying means at a constant positive voltage above said second port of said first amplifying means;
   whereby under the physical law that charge equals capacitance times voltage, the charge of said signal input upon said second port which will flow to capacitance existing between said first and said second ports will be related to said constant positive voltage;
   whereby the guard circuit created thereby between said case and all three said ports contained therein serves to minimize the effect of said capacitance between each said port and said surrounding case and between each said port and external circuitry beyond said case upon said input signal.

2. The circuit apparatus for controlling first amplifying means of claim 1 which further comprises:
   transient coupling means of extremely short time constant for coupling of signals of extreme high frequency to said third port, which signals are thusly in combination with said first amplified input signal thereupon said third port; and
   third positive feedback loop means for feeding back from one of said plurality of subsequent amplifying means to said transient coupling means an amplified signal of even phase with said input signal,
   wherein said positive feedback of said subsequent amplifying means amplified input signal is coupled to said first amplified output of said input signal by said transient coupling means but so weakly and at such short time constant that said positive feedback enhances the frequency response of said amplifier apparatus while not causing self-sustained feedback oscillation.

3. In an amplifier apparatus wherein an input signal is received at the gate junction of a field effect transistor operative as a source follower in the drive of next transistor amplifier stages, a method of mitigating the capacitance seen by said input signal which comprises:
   positively directly feeding back as direct current a first portion of an amplified said input signal from at least one of said next transistor amplifier stages as a first control signal;
   regulating responsively to said first control signal the voltage at the drain of said field effect transistor to be a constant separation from said gate of said field effect transistor, which constant voltage separation is consistent with said operation of said field effect transistor as a source follower; and
   directly feeding back as direct current a second portion of the amplified said input signal from at least one of said next transistor amplifier stages to a case of said input field effect transistor;
   whereby said constant voltage separation between said gate and said drain of said field effect transistor, while said source voltage of said field effect transistor does follow said gate voltage in said source follower operation, results in mitigating the effect of field effect transistor junction capacitances seen by said input signal;
   whereby the guard circuit created thereby minimizes the junction to external circuitry capacitances seen by said input signal.

4. The method according to claim 3 which further comprises:
   positively feeding back a third, extreme high frequency only, portion of the amplified input signal from at least one of said next transistor stages as a second control signal;

modifying with said positive feedback second control signal the essentially constant current flow within the source circuit of said field effect transistor operative as a source follower;

wherein said positive feedback modification of said constant current flow within said source circuit of said field effect transistor is insufficiently large to cause oscillation but aids said field effect transistor source circuit, responsive to said field effect transistor source follower configuration to said input signal, in charging and discharging the parasitic capacitance of said source circuit.

5. In an amplifier circuit wherein an input field effect transistor is operative as a source follower, meaning that there is a field effect transistor for receiving a gate circuit input signal and for amplifying said input signal and for outputting said amplified input signal in the source circuit; and voltage supply means for supplying voltage and current to said field effect transistor; and drain circuit biasing means in conjunction with source circuit biasing means for jointly biasing and operating said field effect transistor with essentially constant source current over at least a finite range of said gate curcuit input signal; and wherein said amplified input signal is conducted to and amplified within subsequent circuit stages, an improvement to the biasing control of said input field effect transistor comprising:

source circuit positive feedback loop means for feeding back only the high frequency component of said amplified input signal from one of said subsequent circuit stages in such phase and magnitude as increases said essentially constant source current during increasing said input signal while decreasing said essentially constant source current during decreasing said input signal while not causing oscillation;

controllable drain circuit biasing means for regulating in response to a control signal the drain circuit voltage of said input field effect transistor; and drain circuit positive feedback loop means for directly feeding back as direct current from one of said subsequent circuit stages said amplified input signal as said control signal;

wherein the magnitude and phase of said feedback control signal as controls said regulated drain circuit biasing means keeps said drain circuit voltage of said input field effect transistor at a constant incremental voltage above said gate circuit input signal;

whereby said positive feedback effects increased frequency response of said source circuit outputting said amplified input signal.

* * * * *